US006762415B1

(12) United States Patent
Strait (10) Patent No.: US 6,762,415 B1
(45) Date of Patent: Jul. 13, 2004

(54) VACUUM CHAMBER WITH RECESSED VIEWING TUBE AND IMAGING DEVICE SITUATED THEREIN

(75) Inventor: David Robert Strait, Madison, WI (US)

(73) Assignee: Imago Scientific Instruments Corporation, Madison, WI (US)

( * ) Notice: Subject to any disclaimer, the term of this patent is extended or adjusted under 35 U.S.C. 154(b) by 0 days.

(21) Appl. No.: 10/419,035

(22) Filed: Apr. 18, 2003

(51) Int. Cl.$^7$ .......................... H01J 37/20; H01J 37/18
(52) U.S. Cl. ........................ 250/440.11; 250/441.11; 250/442.11; 250/306; 356/341; 356/318
(58) Field of Search ................ 250/440.11, 441.11, 250/442.11, 306; 356/341, 318

(56) References Cited

U.S. PATENT DOCUMENTS

| 4,141,458 | A | * | 2/1979 | Brooks et al. ......... 414/331.18 |
| 5,061,850 | A | | 10/1991 | Kelly et al. |
| 5,306,918 | A | * | 4/1994 | Goudonnet et al. .... 250/442.11 |
| 5,347,132 | A | | 9/1994 | Holzman et al. |
| 5,440,124 | A | | 8/1995 | Kelly et al. |
| 5,940,175 | A | * | 8/1999 | Sun ........................ 356/237.3 |
| 2001/0044156 | A1 | | 11/2001 | Kelly et al. |

FOREIGN PATENT DOCUMENTS

WO    WO 99/14793 A1    3/1999

OTHER PUBLICATIONS

Kelly. T.F. and Larson, D.J., "Local–Electrode Atom Probes," Materials Characterization 44, 59–85, (2000).

"Building–Blocks for Vacuum Science and Technology" (Catalog), MDC Vacuum Products Corporation, Hayward, CA, USA, 1999. pp. 496–497.

* cited by examiner

*Primary Examiner*—Nikita Wells
(74) *Attorney, Agent, or Firm*—Craig A. Fieschko, Esq.; DeWitt Ross & Stevens S.C.

(57) ABSTRACT

A vacuum chamber includes chamber walls separating a chamber interior and a chamber exterior, with one or more access ports defined in the chamber walls. A viewing tube extends from the chamber exterior into the chamber interior and terminates in a window. A positioner for imaging devices is then provided within the viewing tube, and is thus situated at least partially within the chamber interior with its imaging device(s) oriented towards the window of the viewing tube to allow imaging of areas within the vacuum chamber. The positioner preferably allows translation and/or rotation of an imaging device within the viewing tube within two perpendicular planes oriented along the axis of the viewing tube, thereby allowing the imaging device to view an area of interest from more angles oriented about the area of interest than would otherwise be possible if the imaging device was situated outside the vacuum chamber.

24 Claims, 4 Drawing Sheets

VACUUM CHAMBER WITH RECESSED VIEWING TUBE AND IMAGING DEVICE SITUATED THEREIN

FIELD OF THE INVENTION

This document concerns an invention relating generally to vacuum chambers, and more specifically to vacuum chambers wherein items are to be subjected to testing, analysis, and/or imaging.

BACKGROUND OF THE INVENTION

When performing operations on objects situated within ultra-high vacuum chambers (UHV chambers), it is often useful to be able to obtain images of the shape and position of the objects. As an example, in the case of an atom probe microscope having a local extraction electrode situated within a UHV chamber, the specimen to be analyzed—which is often provided in the form of a sharp tip—is best analyzed if it is precisely aligned within the aperture of the local electrode (which is generally 1–1000 micrometers in diameter). It is additionally useful to be able to view the specimen's shape and status as experiments are performed.

However, obtaining a suitable view of the specimen with an optical microscope, digital camera, and/or other imaging device can be difficult to achieve. The UHV chambers, which must necessarily have sturdy construction, are generally made of metal with one or more access ports provided over a small area of the chamber walls, with the specimens being centrally located within the chambers to allow greater room to operate on the specimens. The access ports provide limited ability to view the specimen and ascertain its position and status; their distance from the specimen is such that it is difficult to view details of the specimen (even if high-powered optics are used), and additionally they each provide a very limited cone of vision about the specimen (i.e., one may generally see only one primary face of the specimen and very limited views of the sides of the specimen located off of the primary face). It is therefore generally unsatisfactory to optically image a specimen from an access port, since it is extremely difficult to obtain a view of the specimen having resolution in the ideal range (from 10 micrometers down to the sub-micrometer level), and to obtain sufficient views from points orbiting the specimen that one may effectively obtain more than a two-dimensional view of the specimen. As a result, optical imaging devices are generally only employed to obtain very coarse information regarding the position and status of the specimen.

Owing to the foregoing problems, specimen position/status information is often provided by use of indirect measurements. As an example, in the case of atom probe microscopes, measurements of transmitted or backscattered current (as discussed in U.S. Pat. No. 5,440,124 to Kelly et al.), or of the desorption rate of ions from the specimen (U.S. Pat. No. 5,061,850 to Kelly et al.), can indicate specimen location and orientation. However, these methods are only useful if the specimen is already aligned to some degree within the aperture of the microscope. Therefore, imaging is usually performed with use of scanning electron microscopes (SEMs) situated inside the chambers, since these can obtain submicron resolution of specimen position and status from relatively long working distances (i.e., with greater spacing between the SEM and the specimen).

However, while this well-accepted arrangement provides good information, it too is less than ideal. Initially, it is expensive to provide and maintain a SEM. Additionally, in order to establish high vacuum within UHV chambers, the chambers must undergo a heating or "baking" process in order to drive off volatile molecules each time the chamber is opened to the atmosphere. SEMs have components that cannot withstand baking, and therefore portions of the SEMs must be removed prior to each bake cycle and then replaced after the bake cycle is complete. Since SEM components are sensitive and bulky, removal and replacement of SEM components is inconvenient and time-consuming. It would therefore be extremely useful to be able to obtain images of areas within the chambers which have suitable resolution and angular spread without having to resort to use of a SEM.

SUMMARY OF THE INVENTION

The invention involves a vacuum chamber which is intended to at least partially solve the aforementioned problems. To give the reader a basic understanding of some of the advantageous features of the invention, following is a brief summary of preferred versions of the vacuum chamber. As this is merely a summary, it should be understood that more details regarding the preferred versions may be found in the Detailed Description set forth elsewhere in this document. The claims set forth at the end of this document then define the various versions of the invention in which exclusive rights are secured.

A vacuum chamber includes chamber walls separating a chamber interior and a chamber exterior, with one or more access ports defined in the chamber walls. A viewing tube having a flange removably affixed to an access port provides a passage extending into the chamber interior and terminating in an at least partially transparent window. The viewing tube may therefore be installed on a vacuum chamber port by removing any standard cap situated on the access port, and inserting and affixing the viewing tube in place of the cap.

A positioner for imaging devices is then provided within the viewing tube, and is thus situated at least partially within the chamber interior with its imaging device(s) oriented towards the window of the viewing tube to allow imaging of areas within the vacuum chamber. A preferred version of the imaging device positioner includes an arcuate track which has a center of curvature situated within the vacuum chamber interior and which is fixed with respect to the access port, with a positioner carriage being movable along the track. The positioner carriage preferably bears wheels engaging opposing sides of the track, as well as a pinion which engages teeth on the track and which may therefore be actuated to drive the carriage along the track. A positioner subcarriage which bears an imaging device is then movably affixed to the positioner carriage, preferably so that it may be repositioned in a first plane oriented at least substantially perpendicular to the carriage plane and a second plane oriented at least substantially parallel to the carriage plane. The positioner subcarriage may be made repositionable with respect to the positioner carriage by extending one or more threaded members therebetween so that rotation of the threaded member(s) drives the positioner subcarriage with respect to the positioner carriage.

With the viewing tube and imaging device positioner installed, a user may use the imaging device positioner to reorient an imaging device within the viewing tube (and thus within the vacuum chamber interior) to very precisely direct it towards an area of interest within the chamber. Since the imaging device may be situated within the chamber interior very close to the area of interest for imaging and may be repositioned therein, the imaging device may obtain views of the area of interest within a greater viewing cone (i.e., along lines of sight separated by greater angles) than the imaging device would otherwise be able to achieve were it situated outside the vacuum chamber. Additionally, since the viewing tube rests along the same line of sight that the imaging device would require were it situated outside the vacuum chamber, the viewing tube does not unnecessarily occupy or obstruct valuable space within the chamber interior (since such line of sight must necessarily remain unobstructed in any event if the imaging device is to view the area of interest).

Further advantages, features, and objects of the invention will be apparent from the following detailed description of the invention in conjunction with the associated drawings.

DETAILED DESCRIPTION OF PREFERRED VERSIONS OF THE INVENTION

Figure 1:
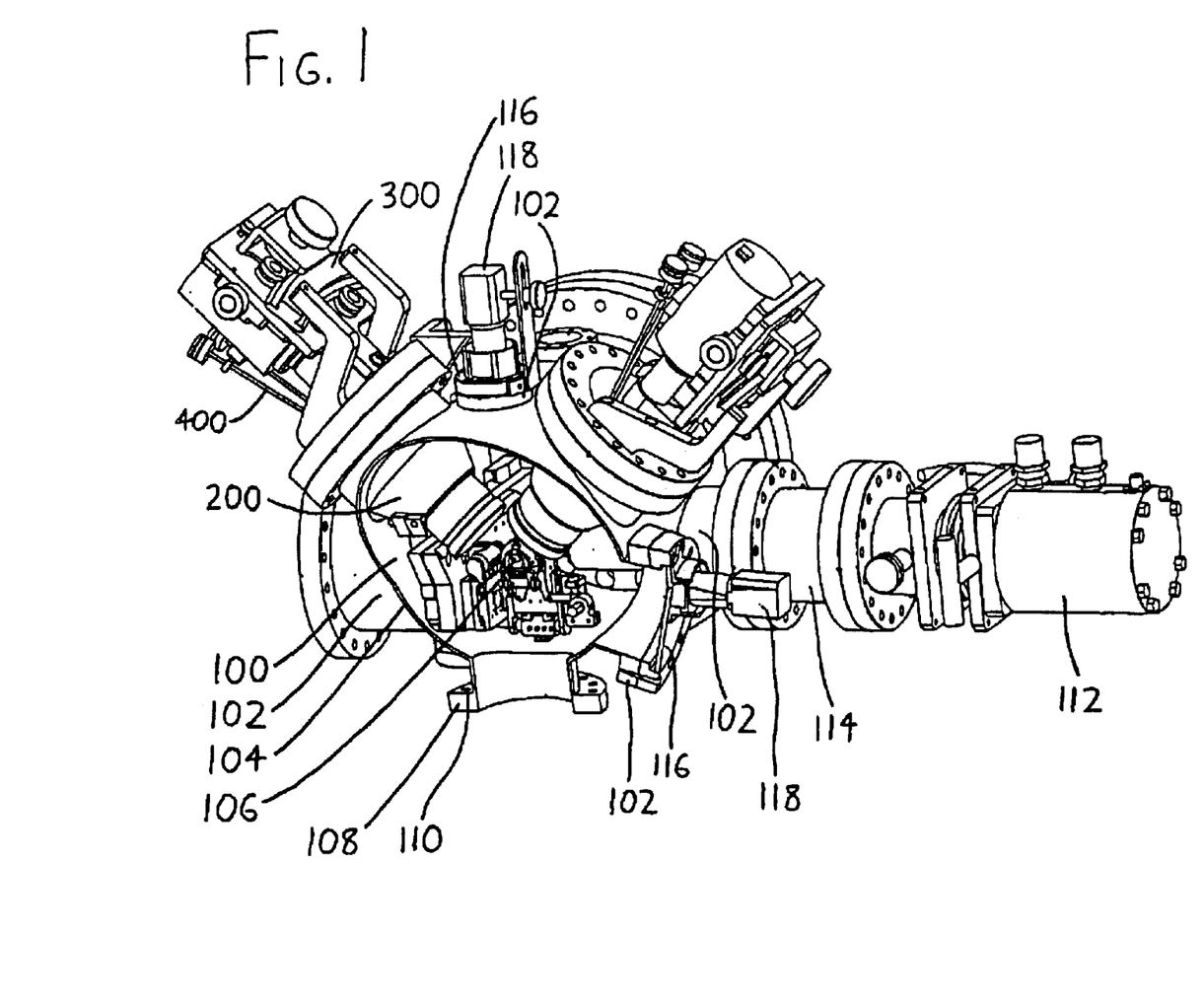
FIG. 1 is a perspective view of a vacuum chamber 100 (shown with its chamber walls 104 partially cut away) having a specimen-bearing positioning stage 106 therein, with the vacuum chamber 100 bearing versions of viewing tubes 200 and imaging device positioners 300 which exemplify the invention.

Referring to FIG. 1, an exemplary vacuum chamber 100 is provided with a number of standard access ports 102 situated on or outside the walls 104 of the vacuum chamber 100, i.e., the entryways of the access ports 102 are situated on or outside the general "envelope" that would be defined by the walls 104 of the vacuum chamber 100 if the access ports 102 were not present. Such standard access ports 102, which are usually clustered about an area of interest within the vacuum chamber 100 (here about a positioning stage 106), extend from the chamber walls 104 to terminate in flanges 108 having a number of attachment apertures 110 circumferentially spaced thereabout to allow attachment of structures to the flanges 108. As an example, a cryostat 112 is shown connected to the vacuum chamber 100 via an intermediate extension tube 114, with this extension tube 114 being affixed to one of the access ports 102. As another example, window-bearing caps 116, with cameras or other imaging devices 118 mounted thereon, may also be affixed to the access ports 102 (with two such caps 116 and imaging devices 118 being shown in FIG. 1).

Such imaging devices 118 are situated distantly from the area of interest 106 of the vacuum chamber 100, and therefore have limited ability to view, magnify, and/or image any objects in the area of interest 106 unless expensive high-magnification optics are used. Additionally, since they have a somewhat limited view of the interior of the vacuum chamber 100, a common approach is to provide multiple imaging devices 118—as depicted in FIG. 1—each situated at a different one of the access ports 102 of the vacuum chamber 100, to allow different areas of the interior of the vacuum chamber 100 to be viewed at different angles. While this provides a simple means of viewing the area of interest 106 from different angles, it can lead to greater expense owing to the need for multiple imaging devices 118. Additionally, if an item of interest 106 is repositioned within the vacuum chamber 100, the user must generally undertake a time-consuming (and annoying) repositioning and refocusing of each one of the imaging devices 118 at the various access ports 102 in order to obtain properly centered and focused views.

The vacuum chamber 100 is also illustrated with an exemplary version of the invention: an inwardly-extending viewing tube 200, and a imaging device positioner 300 mounted to position an imaging device within the viewing tube 200 for close-range imaging of objects within the interior of the vacuum chamber 100. Both the viewing tube 200 and the imaging device positioner 300 will now be discussed in turn in greater detail with reference to FIGS. 2–4.

Figure 2:
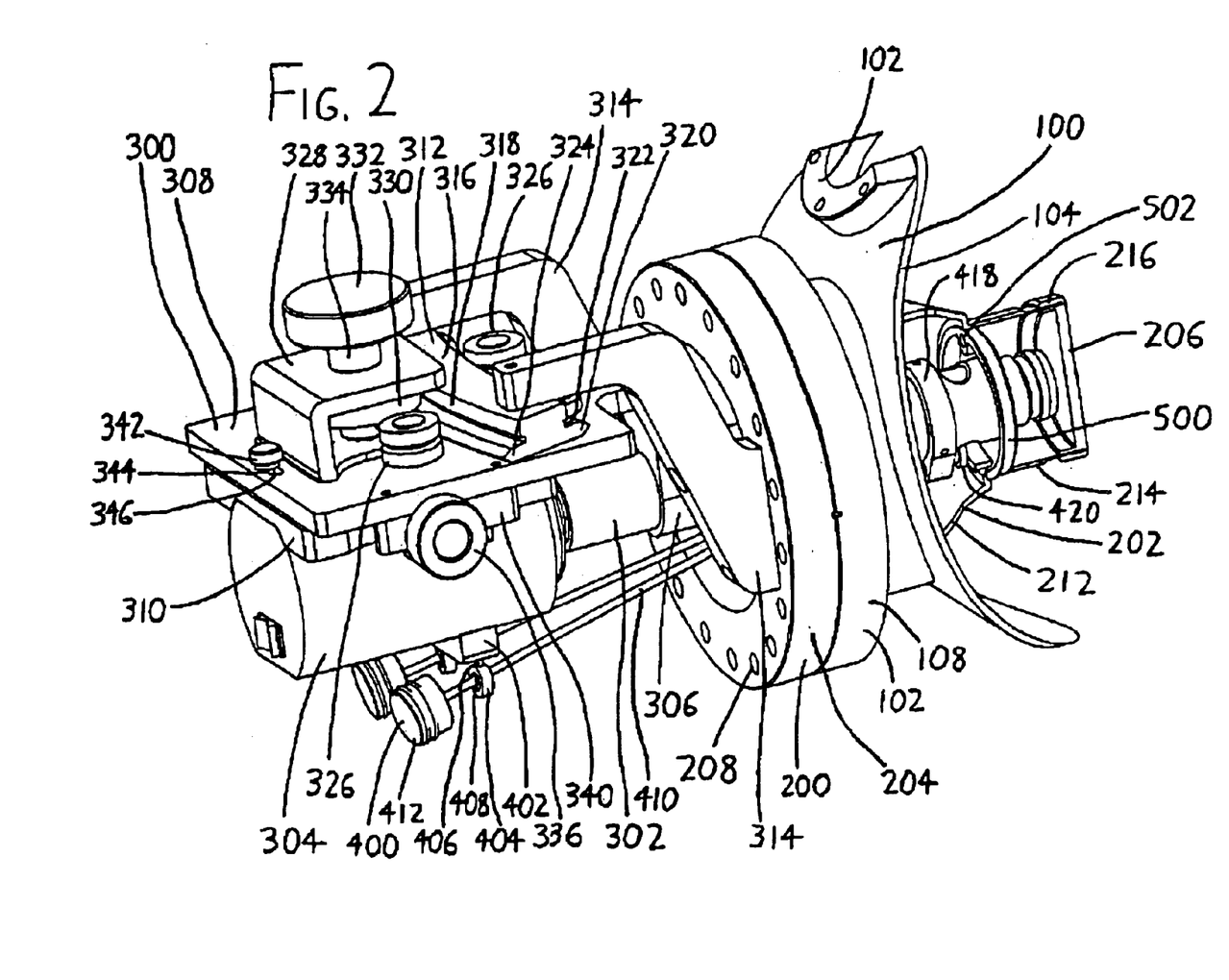
FIG. 2 is a top perspective view of the imaging device positioner 300 of FIG. 1 shown with the viewing tube 200 and vacuum chamber 100 partially cut away.
Figure 4:
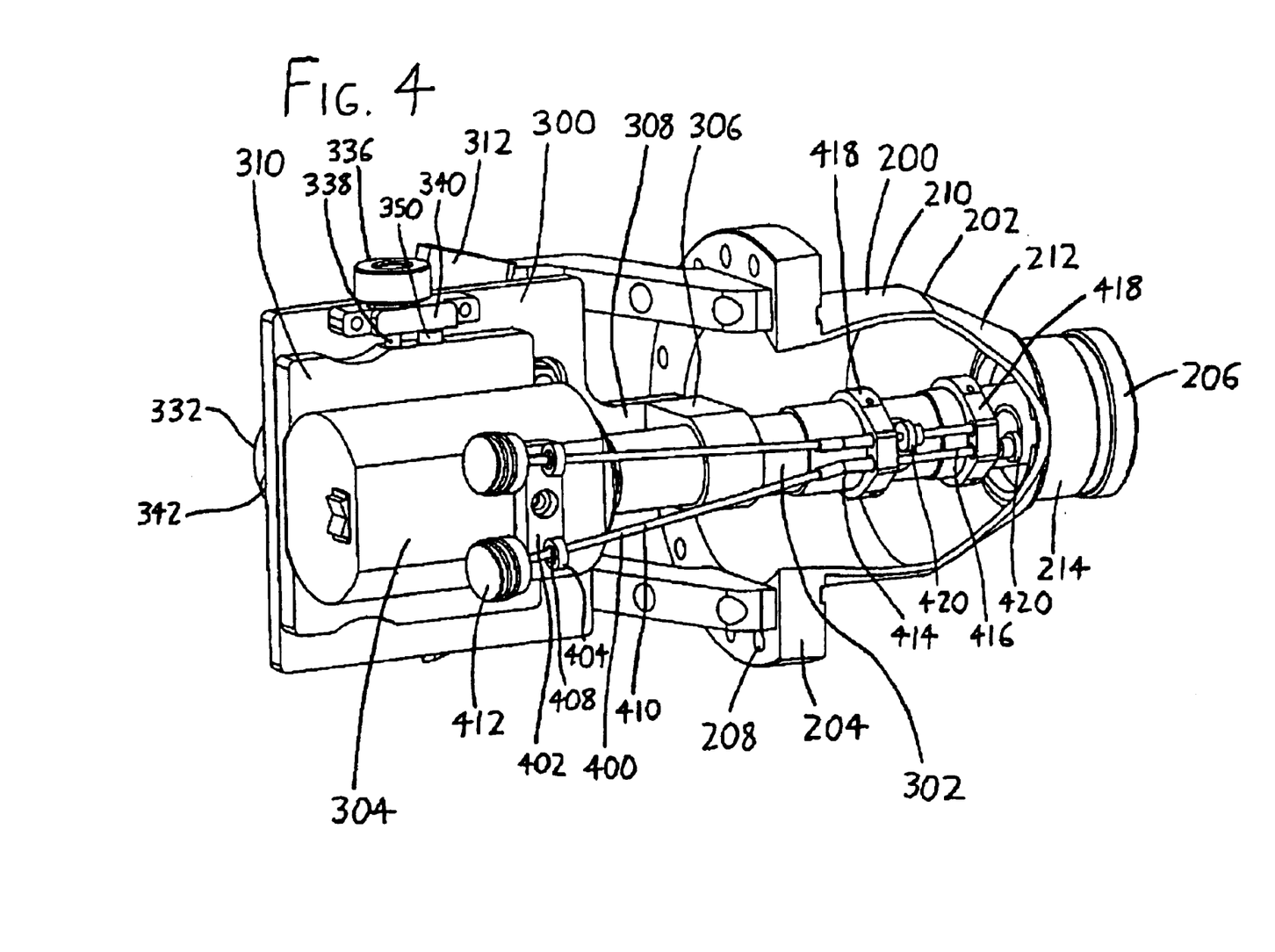
FIG. 4 is a bottom perspective view of the imaging device positioner 300 of FIG. 1 shown with the viewing tube 200 partially cut away.

Looking initially to FIG. 2, the viewing tube 200 includes an elongated tube 202 extending into the interior of the vacuum chamber 100 between a terminal tube flange 204 and a terminal tube window 206 (with such structure also being illustrated in FIG. 4 with the vacuum chamber 100 removed). The tube flange 204 is a standard vacuum flange bearing a number of fastener apertures 208 allowing its fixture to a flange 108 bounding an access port 102 on the vacuum chamber 100, though the flange 204 may take a variety of other forms different from the one depicted in the drawings. Similarly, the viewing tube 200, while shown as including a number of segments (see particularly FIG. 4)—an initial large-diameter cylindrical segment 210, an intermediate frustoconical segment 212, and a final small-diameter segment 214—may be differently configured with less or more segments of varying sizes; for example, it could instead simply take the form of a cylindrical tube. However, the tube 200 is preferably necked down from the tube flange 204 to a smaller-diameter window 206 since a smaller-diameter window 206 may sustain a greater pressure difference between the interior of the chamber 100 and the external atmosphere, and may therefore maintain seal integrity for a longer period of time, at lower cost. The window 206 is preferably a flat glass having low reflection and refraction, and also having a circumferential flange 216 (FIG. 2) protruding from one of its faces wherein the end of the tube 200 may be embedded/fused. Since the area of the window 206 is relatively low, the air pressure on the outside of the window 206 exerts low force across the area of the window 206 when vacuum conditions are present within the chamber 100, and thus the fused region of the window 206 about the flange 216 need not be made so bulky (for sake of strength) that excessive space is consumed within the chamber 100. Non-fused designs (i.e., designs wherein the window 206 rests within a seal at the end of the tube 200) are also possible, with such designs preferably taking into account the fact that the window 206 will be pushed away from the end of the tube 200 by atmospheric pressure rather than into it, as will occur with designs for standard access port caps which bear windows (in other words, sealing arrangements are reversed from the standard arrangement).

Referring then particularly to FIG. 4, the imaging device positioner 300 is shown with a conventional long range (telescopic) microscope 302 which is affixed to a digital camera 304. A preferred microscope 302 is the Optem Zoom 70XL (Model 2.0x mini 299029, Thales Optem, Fairport, N.Y., USA), and a preferred camera 304 is a QImaging Retiga 1300 (RET-M-12, QImaging, Burnaby, BC, CA), though other versions of microscopes and/or cameras may be used. The camera 304 and microscope 302 are preferably rigidly mounted together in such a manner that the camera 304 may record images from the microscope 302. The microscope 302 is then fixed within a pivot block 306 which is pivotally affixed to a positioner carriage 308, and the camera 304 is rigidly mounted to a positioner subcarriage 310 which is adjustably affixed to the positioner carriage 308 in the manner discussed below. (The camera 304 preferably bears threaded mounting holes on one or more of its surfaces for allowing its fixture to a tripod or the like; such mounting holes, not shown in the figures, can be useful to allow fixture of the camera 304 to the positioner subcarriage 310 via fasteners.) The carriage 308 and subcarriage 310 allow repositioning of the microscope 302 and camera 304 with respect to the viewing tube 200 as follows.

Referring particularly to FIG. 2, an arcuate rack 312 is then rigidly mounted to a pair of dogleg mounting arms 314 which extend and are rigidly affixed to the viewport flange 204 of the viewing tube 200 at the fastener apertures 208 (or if all fastener apertures 208 will be occupied, at auxiliary apertures defined in the viewport flange 204). The mounting arms 314 are affixed at their opposing ends to the rack 312. The rack 312 includes an arcuate engagement bar 316 with a toothed face 318 (the teeth not being shown for clarity) facing away from the mounting arms 314, and the rack 312 also includes an arcuate guide bar 320 which is affixed in a plane parallel to (and slightly spaced from) the engagement bar 316 by an intermediate bridge 322. The guide bar 320 has a pair of opposing V-point faces 324, one of which faces towards the mounting arms 314 and the other of which faces away from the mounting arms 314. The toothed face 318 and the V-point faces 324 preferably have the same radius of curvature, and are concentrically oriented about a point within the vacuum chamber 100.

Figure 3:
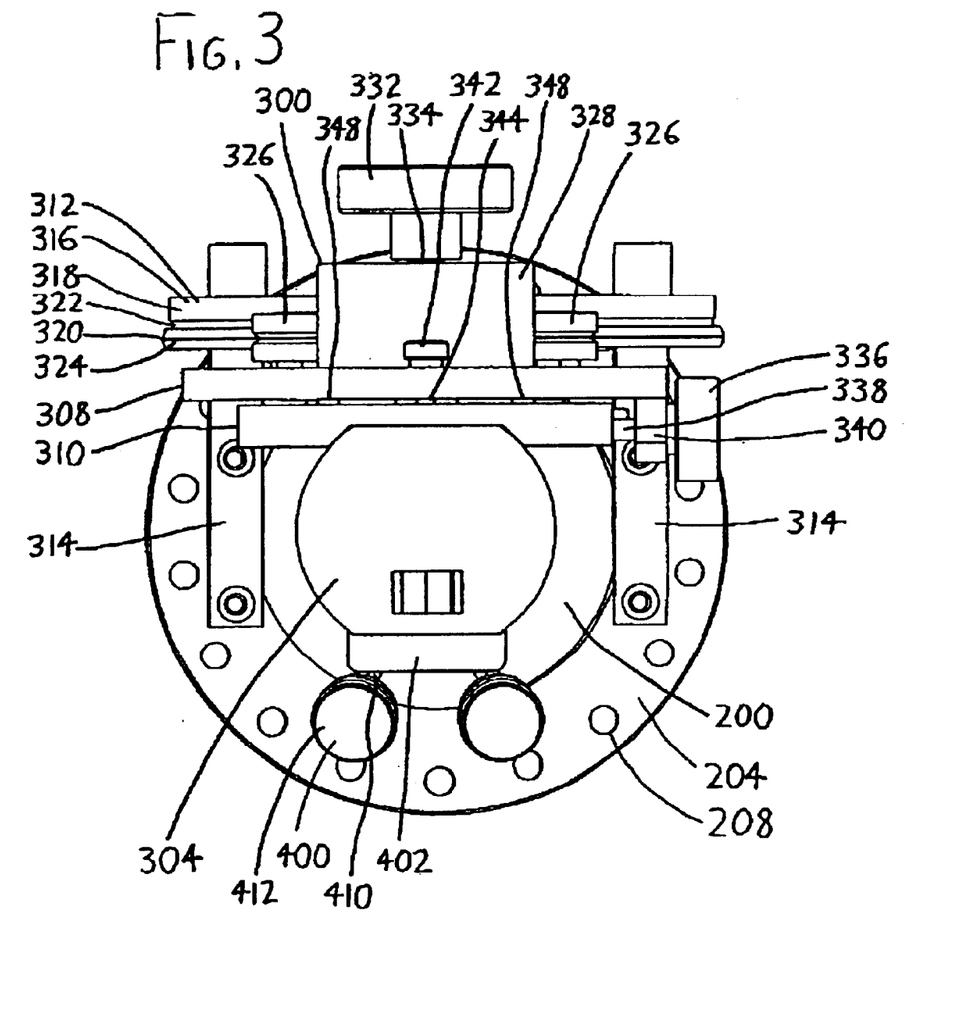
FIG. 3 is an elevational view of one end of the imaging device positioner 300 of FIGS. 1 and 2, shown with the flange 204 of the viewing tube 200 being visible.

Also referring to FIG. 2 and also to FIG. 3, the positioner carriage 308 (and thus the microscope 302 and camera 304) are then movably mounted on the rack 312 in the following manner. Four pulley-like V-wheels 326 are rotatably mounted on the positioner carriage 308 in two pairs, with each pair receiving opposing V-point faces 324 of the rack guide bar 320. (In FIGS. 2 and 3, only one of the V-wheels 326 within each pair are labeled.) Thus, two V-wheels 326 (one from each pair) engage the V-point face 324 of the rack guide bar 320 closer to the viewport flange 204 of the viewing tube 200, and the other two V-wheels 326 (one from each pair) engage the V-point face 324 of the rack guide bar 320 distantly from the viewport flange 204 of the viewing tube 200, with each pair of V-wheels 326 sandwiching the rack guide bar 320 therebetween, to allow the rack guide bar 320 to roll between the wheels 326 along an arcuate path. A tongue 328 extends from the positioner carriage 308, and then towards the viewport flange 204 of the viewing tube 200 along a length oriented generally parallel to the plane of the positioner carriage 308. Looking to FIG. 2, a toothed pinion 330 (the teeth not being illustrated for sake of clarity) is interposed between the tongue 328 and the positioner carriage 308, and the pinion 330 is rotatably adjustable by a eucentric pan knob 332 which is affixed to the pinion 330 by a shaft 334 rotatably mounted in the tongue 328 and extending between the eucentric pan knob 332 and pinion 330. The teeth of the pinion 330 engage the toothed face 318 of the rack engagement bar 316 on the rack 312. Thus, by rotating the eucentric pan knob 332, the pinion 330 is also rotated to drive the positioner carriage 308 along the arcuate path defined by the rack 312. By repositioning the positioner carriage 308 in this manner, the camera 304 and microscope 302 are rotated in a plane along an arcuate path about a point situated within the vacuum chamber 100 (this plane hereinafter being referred to as the "carriage plane").

The positioner subcarriage 310, to which the camera 304 is firmly affixed (as previously noted), is then made adjustable in certain directions with respect to the positioner carriage 308. Initially, a coplanar pan knob 336 is provided which allows the positioner subcarriage 310 to be adjusted in a plane parallel to the carriage plane (i.e., the plane in which the positioner carriage 308 travels upon rotation of the eucentric pan knob 332) and along a direction oriented generally tangentially to the arc of travel defined by the rack 312. As best seen in FIGS. 3 and 4, the coplanar pan knob 336 has a threaded rod 338 (the threads not being shown for sake of clarity) which extends through a slot in a mounting plate 340, with the mounting plate 340 extending from an edge of the face of the positioner carriage 308 opposite the face bearing the tongue 328. The slot in the mounting plate 340, which is not shown, is oriented with its length generally perpendicular to the carriage plane. The threaded rod 338 then extends into the positioner subcarriage 310. Rotation of the coplanar pan knob 336 therefore drives the positioner subcarriage 310 with respect to the positioner carriage 308 in the aforementioned manner, i.e., in a plane parallel to the carriage plane and along a direction oriented generally tangentially to the arc of travel defined by the rack 312. However, the travel of the positioner subcarriage 310 is not truly linear owing to the mounting of the microscope 302 within the pivot block 306 (which is pivotally affixed to the positioner carriage 308); instead, the positioner subcarriage 310 is moved in two degrees of freedom simultaneously, partially translationally along the positioner carriage 308 in a direction oriented generally tangentially to the arc of travel defined by the rack 312, and partially rotationally around the pivot point of the pivot block 306 with respect to the positioner carriage 308. The end effect is that while rotation of the eucentric pan knob 332 repositions the camera 304 and microscope 302 in the carriage plane along an arcuate path, with the line of sight of the camera 304 and microscope 302 remaining directed at the same point within the vacuum chamber 100, rotation of the coplanar pan knob 336 will laterally reset the sighted point within the vacuum chamber 100 along the same plane.

A spacing pan knob 342 is also provided to allow the positioner subcarriage 310 to be adjustably spaced with respect to the positioner carriage 308. Looking to FIGS. 2 and 3, the spacing pan knob 342 bears a threaded rod 344 which extends through a slot 346 defined in the positioner carriage 308 at its edge distant from the viewport flange 204 of the viewing tube 200, with the length of the slot 346 being oriented generally tangentially with respect to the arc of travel defined by the rack 312. The threaded rod 344 then engages the positioner subcarriage 310 such that when the spacing pan knob 342 is rotated, the positioner subcarriage 310 is respaced with respect to the positioner carriage 308 in planes generally parallel to the carriage plane. To assist in maintaining a generally parallel relationship between the positioner subcarriage 310 and positioner carriage 308, springs 348 also extend between the positioner subcarriage 310 and positioner carriage 308, with the springs 348 resting in shallow holes bored within the opposing faces of the positioner subcarriage 310 and positioner carriage 308. The end effect of the overall arrangement of the spacing pan knob 342 is that rotation of the spacing pan knob 342 allows readjustment of the sighted point within the vacuum chamber 100 along planes oriented perpendicular to the carriage plane wherein the positioner carriage 308 travels along the rack 312.

In the foregoing arrangement, mounting of the threaded rod 338 of the coplanar pan knob 336 within the slot (not shown) in the mounting plate 340 allows the spacing pan knob 342 to adjust the spacing of the positioner subcarriage 310 without interference. Similarly, since the threaded rod 344 of the spacing pan knob 342 extends through slot 346 (FIG. 2), the coplanar pan knob 336 may adjust the location of the positioner subcarriage 310 with respect to the positioner carriage 308 without interference. The interposition of the springs 348 between the positioner subcarriage 310 and the positioner carriage 308 is useful in reducing backlash from rotation of the coplanar pan knob 336 and the spacing pan knob 342, and also helps to resiliently maintain the positioner subcarriage 310 uniformly spaced from the positioner carriage 308. In similar fashion, it can be beneficial to interpose a spring 350 (FIG. 4) between the mounting plate 340 and the positioner subcarriage 310. Depending on the orientation of the positioner 300 when it is in use, such springs 348 and 350 may in effect be necessary to bias the positioner subcarriage 310 from the positioner carriage 308 and from the mounting plate 340, since the threaded rods 338 and 344 (which freely ride in slots in the positioner carriage 308 and mounting plate 340) may otherwise be unable to achieve such biasing.

Thus, to summarize the foregoing: the eucentric pan knob 332 of the imaging device positioner 300 allows the camera 304 and microscope 302 to be resituated along different lines of sight directed towards a point within the vacuum chamber 100, while the coplanar pan knob 336 and spacing pan knob 342 allow the location of the point to be adjusted. When combined with the viewing tube 200—which effectively extends the microscope 302 and camera 304 within the interior of the vacuum chamber 100—a user may very precisely direct the microscope 302 and camera 304 to a point of interest within the vacuum chamber 100 for viewing and/or imaging. (Note that throughout this document, when it is stated that the viewing tube 200, microscope 302, camera 304, and/or other imaging device is situated inside or within the interior of the vacuum chamber 100, this is meant in the sense that they are within the envelope generally defined by the vacuum chamber walls 104, but they are not within the vacuum itself, much in the same sense that one might say their hand is within their jacket when inserted into a jacket pocket. In other words, this language refers to the imaging device being within, but separated from, the interior of the vacuum chamber 100.)

Since the microscope 302 is effectively situated within the vacuum chamber 100 when it extends within the viewing tube 200 (and is thus difficult to reach), it is also useful to provide some means for allowing remote focusing of the microscope 302 while it extends within the viewing tube 200. An exemplary arrangement for providing remote focusing will now be described with particular reference to FIGS. 2 and 4.

Initially, the remote focusing means 400 includes an adjustment base 402 affixed to the camera 304. As previously noted, the camera 304 preferably bears threaded attachment holes (not shown) to allow its attachment to a tripod or the like, and such attachment holes (if provided) may be used to effect such attachment. The adjustment base 402 bears a pair of eyes 404 extending from threaded rods 406 (FIG. 2) which extend into the adjustment base 402, and the eyes 404 have sockets defined therein which receive balls 408 in complementary ball-and-socket fashion. The balls 408 have holes defined therein which slidably receive adjustment arms 410. The adjustment arms 410 have control knobs 412 at their ends adjacent the camera 304, and at their opposing ends (best shown in FIG. 4), universal joints 414 connect the adjustment arms 410 to drive shafts 416. The drive shafts 416 are mounted to extend coaxially with the microscope 302 via a rotational fit within mounting rings 418 fit about the barrel of the microscope 302. The drive shafts 416 bear drive wheels 420 thereon, which may frictionally bear against the barrel of the microscope 302 so that when the control knobs 412 of the adjustment arms 410 are rotated, the drive shafts 416 and drive wheels 420 experience corresponding rotation, with the drive wheels 420 bearing against the microscope 302 to rotate its barrel for focusing purposes. Some microscopes (such as the preferred Optem Zoom 70XL) have exposed gears which drive the barrel of the microscope 302 for focusing purposes (with such gears being intended for engagement with adjacent motor drives). If such gears are present, the drive wheels 420 may bear teeth to engage the gears, providing a more positive engagement between the drive wheels 420 and the microscope 302.

It can also be useful to provide some means for illuminating the area viewed by the microscope 302 and camera 304 within the vacuum chamber 100. Looking to FIG. 2, within the viewing tube 200, a mounting ring 500 is removably fit at the juncture between the intermediate frustoconical segment 212 and the small-diameter cylindrical segment 214. The mounting ring 500, which has a portion of its circumference missing such that the ring 500 may radially flex to be fit into and removed from the tube 212, bears one or more bores 502 along its circumference into which fiberoptic cables may be fit. Thus, one may string a fiberoptic cable from the exterior of the vacuum chamber 100 into the vacuum flange 204 and viewing tube 200, and then finally into a bore 502 of the ring 500, so that the fiberoptic cable illuminates the window 206 and the interior of the vacuum chamber 100.

Thus, when it is desirable to obtain a particularly close view of an area within a standard vacuum chamber 100, its access port caps 116 may be removed from one or more of its access ports 102 and viewing tubes 200 may be inserted and installed in their place, with the viewing tubes 200 being oriented towards the area(s) of interest. Imaging device positioners 300 may then be installed at these viewing tubes 200 to precisely direct imaging devices towards the area(s) of interest, allowing users to image the area(s) of interest more closely, accurately, and easily than in the conventional arrangement where imaging devices are situated outside the vacuum chamber 100.

Note that an exemplary preferred version of the invention was described above and shown in the drawings merely to illustrate possible features of the invention. The invention can adopt forms having widely different configurations and components than those discussed above, and modifications which are not excluded from the invention by the claims set forth below are also considered to be within the scope of the invention. Following is an exemplary list of some potential modifications.

First, it is emphasized that the viewing tube 200 and/or imaging device positioner 300 may be used with vacuum chambers having a wide variety of configurations other than the one depicted (for example, having fewer or greater access ports 102 having different sizes and configurations). It should similarly be appreciated that the viewing tube 200 might in some instances be used without the imaging device positioner 300, and conversely the imaging device positioner 300 might be used without the viewing tube 200. As an example, in some instances it might be useful to simply closely monitor the interior of the vacuum chamber 100 without the need to image a precise area therein, in which case an imaging device could simply be situated within the viewing tube 200 without any means for reorienting its line of sight. As another example, if it is not necessary to view a certain area within the vacuum chamber 100 with high resolution, the imaging device positioner 300 may be adapted for use with a standard vacuum chamber viewport—one having a window situated outside the vacuum chamber 100—so that the imaging device positioner 300 may adjustably reposition an imaging device situated entirely outside the vacuum chamber 100.

Second, while the imaging device used within the viewing tube 200 was depicted as including a conventional microscope 302 and camera 304, it should be understood that the invention may use fewer, greater, or other imaging devices. For example, only a microscope 302 or a camera 304 might be used, or an imaging device for detecting electromagnetic spectra outside the visible range (e.g., infrared, ultraviolet, or X-ray spectra) might be used.

Third, keeping in mind that the imaging device positioner 300 may be used to focus an imaging device on areas as small as the millimeter (or even sub-millimeter) scale, it is useful to introduce means for reducing backlash so that the imaged area does not shift or "jump" as a user adjusts one or more of the eucentric pan knob 332, coplanar pan knob 336, and/or spacing pan knob 342. As one example, to better eliminate backlash between the carriage pinion 330 and the toothed face 318 of the engagement bar 316 of the rack 312, it is useful to make at least some of the wheels 326 eccentric, or to otherwise introduce friction between the rack 312 and carriage 308.

Fourth, it is noted that numerous alterations can be made to the preferred version of the imaging device positioner 300 described above without departing from the spirit and scope of the invention. As one example, the linear actuation effected by the coplanar pan knob 336 and its threaded rod 338, and the spacing pan knob 342 and its threaded rod 344, may be effected by other forms of linear actuators (e.g., electromagnetic positioning stages). As another example, the springs 348 and 350 need not take the form of helical springs, and may instead take the form of leaf springs, springs made of strips, blocks, or other structures made of elastomeric or other resiliently flexible materials, or other forms. As still another example, the positioner carriage 308 need not be carried on the rack 312 by V-wheels 326, and instead bearings or other structure on the carriage 308 might ride on the rack 312. Alternatively, the rack 312 might be rigidly affixed to the carriage 308, and the bearing structure carrying the rack 312 might instead be provided on the mounting arms 314 or otherwise be mounted in fixed position with respect to the viewing tube 200.

In summary, the invention is not intended to be limited to the preferred versions of the invention described above, but rather is intended to be limited only by the claims set out below. Thus, the invention encompasses all different versions that fall literally or equivalently within the scope of these claims.

What is claimed is:

1. A vacuum chamber comprising:
   a. chamber walls interposed between a chamber interior and a chamber exterior;
   b. a port defined in the chamber walls;
   c. a viewing tube attending from the port into the chamber interior, wherein the viewing tube is closed by an at least partially transparent window;
   d. an imaging device positioner including:
      i. an arcuate track fixed with respect to the port;
      ii. a positioner carriage movable along the track;
      iii. a positioner subcarriage movably affixed to the positioner carriage; and
      iv. an imaging device situated on the positioner subcarriage.

2. The vacuum chamber of claim 1 wherein at least a portion of the imaging device extends through the port and into the viewing tube and chamber interior.

3. The vacuum chamber of claim 1 wherein:
   a. the positioner carriage moves along the track in a carriage plane;
   b. the positioner subcarriage is movable with respect to the positioner carriage:
      i. in a first plane oriented at least substantially perpendicular to the carriage plane; and
      ii. in a second plane oriented at least substantially parallel to the carriage plane.

4. The vacuum chamber of claim 1 further comprising:
   a. one or more springs interposed between the positioner carriage and positioner subcarriage, wherein the springs bias the positioner carriage and positioner subcarriage apart; and
   b. one or more threaded members extending between the positioner carriage and positioner subcarriage, wherein rotation of the threaded members repositions the positioner subcarriage with respect to the positioner carriage.

5. A vacuum chamber comprising:
   a. chamber walls surrounding a chamber interior;
   b. a port defined in the chamber walls, the port extending between the chamber interior and a chamber exterior;
   c. a viewing tube:
      i. extending from the port into the chamber interior, and
      ii. being closed by a window situated within the chamber interior, the window being at least partially transparent.

6. The vacuum chamber of claim 5 wherein the viewing tube includes a flange removably affixed to the port, whereby the viewing tube may be removed from the port.

7. The vacuum chamber of claim 5 wherein the entirety of the viewing tube extends between:
   a. a circumferential flange affixed to the port, and
   b. the window.

8. The vacuum chamber of claim 5 wherein the viewing tube decreases in diameter between the port and the window.

9. The vacuum chamber of claim 5 further comprising:
   a. an imaging device; and
   b. an imaging device positioner movably mounting the imaging device at least partially within the viewing tube and the chamber interior.

10. The vacuum chamber of claim 9 wherein the imaging device positioner includes:
    a. an arcuate track fixed with respect to the port;
    b. a positioner carriage movable along the track; and
    c. a positioner subcarriage whereupon the imaging device is situated, the positioner subcarriage being movably affixed to the positioner carriage.

11. A vacuum chamber comprising:
    a. chamber walls surrounding a chamber interior;
    b. a port defined in the chamber walls, the port extending between the chamber interior and a chamber exterior;
    c. an imaging device positioner including:
       i. an arcuate track fixed with respect to the port;

ii. a positioner carriage movable along the track;
   iii. a positioner subcarriage movably affixed to the positioner carriage; and
   iv. an imaging device situated on the positioner subcarriage.

12. The vacuum chamber of claim 11 wherein the arcuate track has a center of curvature situated within the chamber interior.

13. The vacuum chamber of claim 11 wherein the positioner carriage includes wheels engaging opposing sides of the track.

14. The vacuum chamber of claim 13 wherein the positioner carriage further includes a pinion engaging the track.

15. The vacuum chamber of claim 11 wherein one or more springs are interposed between the positioner carriage and positioner subcarriage, and wherein the springs bias the positioner carriage and positioner subcarriage apart.

16. The vacuum chamber of claim 15 further comprising one or more threaded members extending between the positioner carriage and positioner subcarriage, wherein rotation of the threaded members repositions the positioner subcarriage with respect to the positioner carriage.

17. The vacuum chamber of claim 11 wherein:
   a. the positioner carriage moves along the track in a carriage plane, and
   b. a first threaded member extends between the positioner subcarriage and the positioner carriage, and rotation of the first threaded member moves the positioner subcarriage relative to the positioner carriage in a direction at least substantially perpendicular to the carriage plane.

18. The vacuum chamber of claim 17 further comprising a second threaded member extending between the positioner subcarriage and the positioner carriage, wherein rotation of the second threaded member moves the positioner subcarriage relative to the positioner carriage in a direction at least substantially parallel to the carriage plane.

19. The vacuum chamber of claim 11 wherein at least a portion of the imaging device extends through the port and within the chamber interior.

20. The vacuum chamber of claim 11 further comprising a viewing tube:
   a. extending from the port into the chamber interior, and
   b. being closed by a window situated within the chamber interior, the window being at least partially transparent, wherein the imaging device extends at least partially into the viewing tube.

21. A vacuum chamber comprising:
   a. chamber walls interposed between a chamber interior and a chamber exterior, and surrounding the chamber interior;
   b. a port defined in the chamber walls between the chamber interior and the chamber exterior;
   c. a viewing tube extending from the port into the chamber interior, wherein the viewing tube is closed by an at least partially transparent window situated within the chamber interior;
   d. an imaging device positioner including:
      i. an arcuate track fixed with respect to the port;
      ii. a positioner carriage movable along the track;
      iii. a positioner subcarriage movably affixed to the positioner carriage; and
      iv. an imaging device situated on the positioner subcarriage, wherein at least a portion of the imaging device extends through the port and into the viewing tube and chamber interior.

22. The vacuum chamber of claim 21 wherein:
   a. the positioner carriage moves along the track in a carriage plane;
   b. the positioner subcarriage is movable with respect to the positioner carriage:
      i. in a first plane oriented at least substantially perpendicular to the carriage plane; and
      ii. in a second plane oriented at least substantially parallel to the carriage plane.

23. The vacuum chamber of claim 21 further comprising:
   a. one or more springs interposed between the positioner carriage and positioner subcarriage, wherein the springs bias the positioner carriage and positioner subcarriage apart; and
   b. one or more threaded members extending between the positioner carriage and positioner subcarriage, wherein rotation of the threaded members repositions the positioner subcarriage with respect to the positioner carriage.

24. The vacuum chamber of claim 21 wherein the viewing tube decreases in diameter between the port and the window.

* * * * *